United States Patent
Yang et al.

(10) Patent No.: US 11,905,587 B2
(45) Date of Patent: Feb. 20, 2024

(54) ALLOY COATED STEEL SHEET

(71) Applicants: POSCO, Pohang-si (KR); RESEARCH INSTITUTE OF INDUSTRIAL SCIENCE & TECHNOLOGY, Pohang-si (KR)

(72) Inventors: Ji Hoon Yang, Pohang-si (KR); Jae In Jeong, Pohang-si (KR); Kyung Hwang Lee, Incheon (KR); Yong Hwa Jung, Pohang-si (KR); Tae Yeob Kim, Pohang-si (KR)

(73) Assignees: POSCO CO., LTD, Pohang-si (KR); RESEARCH INSTITUTTE OF INDUSTRIAL SCIENCE & TECHNOLOGY, Pohang-si (KR)

( * ) Notice: Subject to any disclaimer, the term of this patent is extended or adjusted under 35 U.S.C. 154(b) by 162 days.

(21) Appl. No.: 17/414,283

(22) PCT Filed: Dec. 18, 2019

(86) PCT No.: PCT/KR2019/018027
§ 371 (c)(1),
(2) Date: Jul. 22, 2021

(87) PCT Pub. No.: WO2020/130640
PCT Pub. Date: Jun. 25, 2020

(65) Prior Publication Data
US 2022/0074041 A1    Mar. 10, 2022

(30) Foreign Application Priority Data

Dec. 18, 2018  (KR) ........................ 10-2018-0164394

(51) Int. Cl.
*C23C 14/16* (2006.01)
*C23C 14/58* (2006.01)
(Continued)

(52) U.S. Cl.
CPC ............ *C23C 14/165* (2013.01); *B32B 15/01* (2013.01); *B32B 15/012* (2013.01);
(Continued)

(58) Field of Classification Search
CPC ..... C23C 28/02; C23C 28/021; C23C 28/023; C23C 28/025; C23C 2/12; C23C 2/26;
(Continued)

(56) References Cited

U.S. PATENT DOCUMENTS 6,635,359 B1    10/2003   Kurosaki et al.
2009/0011277 A1  1/2009   Liu et al.
(Continued)

FOREIGN PATENT DOCUMENTS

CN        1369020 A    9/2002
CN      102449193 A    5/2012
(Continued)

OTHER PUBLICATIONS

Extended European Search Report dated Aug. 6, 2021 issued in European Patent Application No. 19897774.6.
(Continued)

*Primary Examiner* — Michael E. La Villa
(74) *Attorney, Agent, or Firm* — Morgan, Lewis & Bockius LLP (57) ABSTRACT

The present invention relates to an alloy-coated steel sheet comprising: a steel sheet, and Al—Mg—Si—Zn alloy layer positioned on the steel sheet, wherein the Al—Mg—Si—Zn alloy layer comprises a Mg—Zn alloy phase, and wherein the Mg—Zn alloy phase comprises $MgZn_2$ and $Mg_2Zn_{11}$, and the Mg—Zn alloy phase further comprises at least one of $MgZn$, $Mg_{21}Zn_{25}$, $Mg_{51}Zn_{20}$ and $Mg_2Zn_3$.

11 Claims, 5 Drawing Sheets

(51) Int. Cl.

| | | |
|---|---|---|
| C23C 2/12 | (2006.01) | |
| C23C 2/28 | (2006.01) | |
| C23C 28/02 | (2006.01) | |
| C21D 9/46 | (2006.01) | |
| B32B 15/01 | (2006.01) | |
| C23C 14/56 | (2006.01) | |
| C23C 2/26 | (2006.01) | |
| C22C 30/06 | (2006.01) | |
| C22C 21/06 | (2006.01) | |
| B32B 15/18 | (2006.01) | |
| C22C 18/00 | (2006.01) | |
| C23C 2/06 | (2006.01) | |
| C23C 30/00 | (2006.01) | |
| B32B 15/04 | (2006.01) | |
| C23C 14/14 | (2006.01) | |
| C22C 21/10 | (2006.01) | |
| C22C 21/00 | (2006.01) | |
| C23C 14/06 | (2006.01) | |
| C22C 18/04 | (2006.01) | |

(52) U.S. Cl.
CPC ............ *B32B 15/013* (2013.01); *B32B 15/04* (2013.01); *B32B 15/043* (2013.01); *B32B 15/18* (2013.01); *C21D 9/46* (2013.01); *C22C 18/00* (2013.01); *C22C 18/04* (2013.01); *C22C 21/00* (2013.01); *C22C 21/06* (2013.01); *C22C 21/10* (2013.01); *C22C 30/06* (2013.01); *C23C 2/06* (2013.01); *C23C 2/12* (2013.01); *C23C 2/26* (2013.01); *C23C 2/28* (2013.01); *C23C 14/06* (2013.01); *C23C 14/14* (2013.01); *C23C 14/16* (2013.01); *C23C 14/562* (2013.01); *C23C 14/5806* (2013.01); *C23C 28/02* (2013.01); *C23C 28/021* (2013.01); *C23C 28/023* (2013.01); *C23C 28/025* (2013.01); *C23C 30/00* (2013.01); *C23C 30/005* (2013.01); *Y10T 428/12736* (2015.01); *Y10T 428/12743* (2015.01); *Y10T 428/12757* (2015.01); *Y10T 428/12799* (2015.01); *Y10T 428/12951* (2015.01); *Y10T 428/12958* (2015.01); *Y10T 428/12972* (2015.01)

(58) Field of Classification Search
CPC .. C23C 2/28; C23C 2/06; C23C 30/00; C23C 30/005; C23C 14/165; C23C 14/16; C23C 14/562; C23C 14/5806; C23C 14/06; C23C 14/14; C21D 9/46; B32B 15/01; B32B 15/012; B32B 15/013; B32B 15/04; B32B 15/043; B32B 15/18; C22C 18/00; C22C 18/04; C22C 21/00; C22C 21/10; C22C 21/06; C22C 30/06; Y10T 428/12736; Y10T 428/12743; Y10T 428/12757; Y10T 428/12799; Y10T 428/12951; Y10T 428/12958; Y10T 428/12972
See application file for complete search history.

(56) References Cited

U.S. PATENT DOCUMENTS

| | | | |
|---|---|---|---|
| 2012/0282488 A1 | 11/2012 | Fujii et al. | |
| 2019/0001623 A1* | 1/2019 | Yang | ............ C22C 21/08 |
| 2019/0366687 A1* | 12/2019 | Kwak | ............ C22C 38/002 |

FOREIGN PATENT DOCUMENTS

| | | |
|---|---|---|
| CN | 108463574 A | 8/2018 |
| JP | H01-139755 A | 6/1989 |
| JP | H04-052284 A | 2/1992 |
| JP | 2001-115247 A | 4/2001 |
| JP | 2006-089822 A | 4/2006 |
| JP | 2006-193791 A | 7/2006 |
| JP | 2010-018876 A | 1/2010 |
| JP | 4542434 B2 | 9/2010 |
| JP | 2019-506525 A | 3/2019 |
| JP | 2020-509218 A | 3/2020 |
| KR | 10-2002-0040771 A | 5/2002 |
| KR | 10-2007-0044506 A | 4/2007 |
| KR | 10-2012-0112450 A | 10/2012 |
| KR | 10-2013-0074646 A | 7/2013 |
| KR | 10-2013-0074647 A | 7/2013 |
| KR | 10-2014-0057227 A | 5/2014 |
| KR | 10-2014-0085669 A | 7/2014 |
| KR | 10-2014-0085811 A | 7/2014 |
| KR | 10-2014-0086860 A | 7/2014 |
| KR | 10-2014-0087405 A | 7/2014 |
| KR | 101527144 B1 | 6/2015 |
| KR | 10-2016-0136314 A | 11/2016 |
| KR | 10-2017-0076234 A | 7/2017 |
| KR | 10-2017-0117845 A | 10/2017 |
| KR | 10-2017-0117846 A | 10/2017 |
| KR | 10-2017-0117847 A | 10/2017 |
| KR | 10-2017-0117848 A | 10/2017 |
| KR | 10-2017-0122242 A | 11/2017 |
| KR | 101819394 B1 | 1/2018 |
| KR | 10-2018-0074990 A | 7/2018 |
| KR | 10-2019-0001447 A | 1/2019 |
| KR | 10-1940886 B1 | 1/2019 |
| WO | 2014/059475 A1 | 4/2014 |
| WO | 2017/111561 A1 | 6/2017 |
| WO | WO 2017/111561 A1 * | 6/2017 |
| WO | 2018/124629 A1 | 7/2018 |
| WO | WO 2018/124629 A1 * | 7/2018 |

OTHER PUBLICATIONS

K. Honda, et al., "Solidification Structure of the Coating Layer on Hot-Dip Zn-11%Al-3%Mg-0.2%Si-Coated Steel Sheet," Materials Transactions, vol. 49, No. 6, (2008), pp. 1395-1400, (Apr. 2008).

M. Liu, et al., "Effect of interlayer composition on the microstructure and strength of diffusion bonded Mg/Al joint," Materials and Design, vol. 30, Issue 10, Dec. 2009, pp. 4548-4551.

Written Opinion and International Search Report dated Apr. 13, 2020 issued in International Patent Application No. PCT/KR2019/018027 (with English translation).

Indian Office Action dated Jul. 29, 2021 issued in Indian Patent Application No. 202147032136 (with English translation).

Decision of Grant dated Jul. 25, 2023 for corresponding Japanese Patent Application No. 2021-534754.

* cited by examiner

| Division | 500 hr | 1000 hr | 1900 hr | 2700 hr | 4500 hr |
|---|---|---|---|---|---|
| Comparative Example 1 | | | | | |
| Example 1 | | | | | |
| Example 3 | | | | | |
| Example 5 | | | | | |
| Example 6 | | | | | |
| Example 7 | | | | | |

ALLOY COATED STEEL SHEET

CROSS-REFERENCE OF RELATED APPLICATIONS

This application is the U.S. National Phase under 35 U.S.C. § 371 of International Patent Application No. PCT/KR2019/018027, filed on Dec. 18, 2019, which claims priority to and the benefit of Korean Application No. 10-2018-0164394 filed in the Korean Intellectual Property Office on Dec. 18, 2018, and Korean Application No. 10-2019-0169950, filed in the Korean Intellectual Property Office on Dec. 18, 2019, the entire contents of which are incorporated by herein by reference.

BACKGROUND OF THE INVENTION

(a) Field of the Invention

The present invention relates to an alloy-coated steel sheet and manufacturing method thereof. More specifically, the present invention relates to an alloy-coated steel sheet and manufacturing method thereof having advantages of improving corrosion resistant and sacrificial corrosion prevention characteristics.

(b) Description of the Related Art

Iron is metal that is industrially and most widely used due to abundant resources, excellent characteristic, and low price. Despite many advantages, iron has a disadvantage in that it undergoes an electrochemical reaction with oxygen or water, resulting in corrosion that elutes iron ions, resulting in lower performance. Iron rust caused by corrosion of iron includes various stoichiometric oxides and hydroxides and is continuously oxidized over time, which is one of the characteristics of iron. Iron is processed and used in various forms and, in the case of vehicles or a construction material and home appliances, a steel sheet that is cold rolled, i.e., a cold rolled steel sheet has been mainly used.

As a representative method of preventing a steel sheet from being corroded, another metal is plated on a surface of the steel sheet. A plated film type is classified into a sacrificial corrosion prevention type film and a blocking corrosion prevention type film. The sacrificial corrosion prevention type film is formed by covering metal that is easily oxidized and easily gets rusty, such as zinc, magnesium, or aluminum, compared with iron and, in this case, the covered metal is preferentially corroded to protect a steel sheet. The blocking corrosion prevention type film is formed by covering metal that is difficult to corrode, such as lead or tin, compared with a steel sheet, to prevent water and oxygen from reaching iron.

Currently, zinc plating has been most widely used prevent a steel sheet from being corroded. After the zinc plated steel sheet is developed, various efforts are underway to improve corrosion resistance and, one of these is to cover a zinc alloy. High corrosion resistant materials using an alloy include Zn—Al, Zn—Ni, Zn, Fe, Zn—Al—Mg, or the like. Such zinc or such a zinc alloy plated steel sheet has been widely used in construction materials and home appliances in addition to vehicles.

Aluminum has also been used for anti-corrosion of a steel sheet and is used in more various application fields than zinc. An aluminum film has aesthetical color and excellent corrosion resistant characteristic and heat resistance and, thus, has been used in coating of a conductive film of a semiconductor, a protective film of a magnetic material or a steel sheet, a home appliance of a thermal system, or a vehicle silencer as well as in a film for ornamental purposes, such as a cosmetics case or an accessory.

An aluminum film is manufactured via a vacuum coating, electroplating, or hot-dip plating method. However, electroplating has degraded producibility due to low efficiency and, thus, mostly uses a hot-dip plating method and a vacuum coating method.

An aluminum plated steel sheet has excellent corrosion resistance and, on the other hand, when a film becomes defective, the defective portion is disadvantageously and intensively corroded because aluminum has degraded sacrificial corrosion prevention characteristic compared with zinc. Accordingly, the hot-dip aluminum plated steel sheet has a high thickness equal to or 15 microns (um) to overcome this problem. The hot-dip aluminum plated steel sheet is also processed at high temperature and, thus, workability is disadvantageously degraded while an Al—Fe Si alloy is formed at an interface.

An aluminum film using vacuum coating has been applied with a low thickness in most uses and, in the case of corrosion resistant coating, coating is generally performed with a thickness of several microns.

In the case of the aluminum film, when a thickness is equal to or less than several microns, red rust is generated over above 72 hours in a salt spray test. Accordingly, there is a need to improve the characteristic of aluminum to apply aluminum to a steel sheet via corrosion resistant coating. In addition, aluminum has degraded sacrificial corrosion prevention characteristic compared with zinc and, thus, when red rust is generated once, red rust is disadvantageously and entirely spread for a short time. Accordingly, there is a need for an urgent research to overcome the above problem.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention provides an alloy-coated steel sheet and manufacturing method thereof having advantages of improving corrosion resistant and sacrificial corrosion prevention characteristics.

An alloy-coated steel sheet according to an exemplary embodiment of the present invention comprises a steel sheet; and Al—Mg—Si—Zn alloy layer positioned on the steel sheet, wherein the Al—Mg—Si—Zn alloy layer comprises a Mg—Zn alloy phase, and wherein the Mg—Zn alloy phase comprises $MgZn_2$ and $Mg_2Zn_{11}$, and the Mg—Zn alloy phase further comprises at least one of MgZn, $Mg_{21}Zn_{25}$, $Mg_{51}Zn_{20}$ and $Mg_2Zn_3$.

The Al—Mg—Si—Zn alloy layer may further comprise at least one of Al—Mg alloy phase and Mg—Si alloy phase.

The Al—Mg—Si—Zn alloy layer may comprise 1 to 45 wt % of Zn based on 100 wt % of total.

The Al—Mg—Si—Zn alloy layer may comprise 5 to 30 wt % of Mg based on 100 wt % of total.

The Al—Mg—Si—Zn alloy may further comprise at least one of Al—Mg alloy phase and Mg—Si alloy phase.

The Al—Mg alloy phase may comprise at least one of $Al_3Mg_2$ and $Al_{12}Mg_{17}$.

The Mg—Si alloy phase may comprise $Mg_2Si$.

The alloy-coated steel sheet may further comprise Al—Fe—Si alloy layer positioned between the steel sheet and the Al—Mg—Si—Zn alloy layer.

A method of manufacturing an alloy-coated steel sheet according to another embodiment of the present invention comprises a preparation step of preparing a plated steel sheet formed a plated layer containing Al and Si; a first coating step of forming an Mg coated layer containing Mg on the plated layer; second coating step of forming a Zn coated layer containing Zn on the Mg coated layer; and a heat treatment step of heat-treating the plated steel sheet on which the Mg coated layer and the Zn coated layer are formed to diffuse the Mg and Zn into the plated layer.

In the preparation step, the plated steel sheet may be a hot-dip aluminum plated steel sheet.

In the first coating step and the second coating step, the Mg coated layer and the Zn coated layer may be formed using physical vapor deposition (PVD).

In the heat treatment step, the plated steel sheet is heat-treated at a temperature of 300 to 450° C.

In the heat treatment step, the plated steel sheet is heat-treated for 5 to 600 seconds.

According to an alloy-coated steel sheet and a method for manufacturing the same to an exemplary embodiment of the present invention, the corrosion resistant and sacrificial corrosion prevention characteristics may be improved by forming an Al—Mg—Si—Zn alloy layer containing an Mg—Zn alloy phase.

BRIEF DESCRIPTION OF THE DRAWINGS

FIG. 3(a) is a glow discharge spectroscopic analysis result of 1.2 wt % of a Zn content, FIG. 3(b) is a 2.6 wt % of a Zn content, and FIG. 3(c) is a 7.9 wt % of a Zn content.

DETAILED DESCRIPTION OF THE EMBODIMENTS

The terms "first", "second", "third" and the like are used to describe various parts, components, areas, layers and/or sections, but are not limited thereto. These terms are only used to distinguish one part, component, area, layer or section from another. Accordingly, a first part, component, region, layer, or section stated below may be referred to as a second part, component, region, layer or section without departing from the scope of the present disclosure.

The terminology used herein is for the purpose of describing particular embodiments only and is not intended to be limiting of the present disclosure. As used herein, the singular forms are intended to include the plural forms as well, unless the context clearly indicates otherwise. It will be further understood that the terms "comprising" and "including" when used in this specification, specify the presence of stated features, regions, integers, steps, operations, elements, and/or components, but do not preclude the presence or addition of one or more other features, regions, integers, steps, operations, elements, and/or components.

When a part is referred to as being "on" or "on" another part, it may be directly on or on the other part, or the other part may be involved in between. In contrast, when a part refers to being "directly above" another part, the other part is not interposed therebetween.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the present invention will be described in detail so that those of ordinary skill in the art to which the present invention pertains may easily implement them. As those skilled in the art would realize, the described embodiments may be modified in various different ways, all without departing from the spirit or scope of the present invention.

Recently, in order to solve the problems of the hot-dip aluminum plated steel sheet described in the background art, studies have been conducted to improve sacrificial corrosion prevention together with corrosion resistance by adding magnesium to the hot-dip aluminum plated steel sheet containing silicon.

For example, studies have been conducted to manufacture a coated steel sheet having excellent corrosion resistance by manufacturing an Al—Mg—Si plated steel sheet by hot-dip plating. However, in the case of manufacturing the steel sheet by hot-dip plating, there is a problem in that there is a limit to a control of an Mg content and in the case of a thin plating of 20 g/m$^2$ or less, there is a disadvantage in that the corrosion resistance is rapidly deteriorated. Further, an $Mg_2Si$ alloy phase is known to improve the corrosion resistance, but in this case, there is a problem in that characteristics are improved only in a small range of abound 6% of Mg.

The Al—Mg—Si plated steel sheet is known to have excellent corrosion resistance because the $Mg_2Si$ phase is formed on the plated layer. The Mg Si phase has been reported to improve the corrosion resistance of the Al—Mg—Si plated steel sheet when an area ratio in the plated layer is 0.5 or more and 30% or less and a long diameter of the $Mg_2Si$ phase is 10 um or less. However, since the Al—Mg—Si plated steel sheet manufactured by the hot-dip plating method has a limitation to the control of the Mg content due to the manufacturing process, it is not easy to manufacture the Al—Mg—Si plated steel sheet having a predetermined content or more of Mg content (about 15% or more). Due to the Mg content limitation of the Al—Mg—Si plated steel sheet and a high processing temperature, it is difficult to form an $Al_3Mg_2$ phase or an $Al_{12}Mg_{17}$ phase in the Al—Mg—Si alloy layer in addition to the $Mg_2Si$ phase as an intermetallic compound.

As another example, there are studies on a method of forming an Al—Mg alloy layer by depositing Mg while a substrate coated with aluminum is heated at 350° C. or more and 500° C. or less in vacuum and a method of coating and then heat-treating Mg on the hot-dip aluminum plated steel sheet by physical vapor deposition. However, in these methods, since Mg is deposited on the substrate heated at a high temperature in vacuum, the loss of steam may occur and characteristic change data in accordance with the generation of an intermetallic compound or the intermetallic compound are not presented with respect to an Al—Mg—Si layer.

In order to solve the problems of the aforementioned hot-dip aluminum plated steel sheet and the problems of the Al—Mg alloy steel sheet described in the present invention, an Al—Mg—Si coated steel sheet with improved sacrificial corrosion prevention characteristic by coating Mg on hot-dip aluminum steel sheets using physical vapor deposition and diffusion heat treatment to increase Mg content and form intermetallic compounds in the plated layer was developed. According to the present invention, since Mg is coated on the hot-dip aluminum plated steel sheet by a physical vapor deposition method, there is no limitation to the Mg content control of the Al—Mg—Si coated layer and it is possible to manufacture a structure of various coated layers.

To provide an alloy-coated steel sheet that provides sacrificial corrosion resistance by depositing Mg on a molten aluminum-coated steel sheet containing silicon and forming an alloy film through heat treatment, and simultaneously, has a high corrosion resistance characteristic even at a thin thickness.

The prevent invention provides high corrosion resistant steel sheet with improved corrosion resistance by adding Zn to an Al—Mg—Si coated steel sheet and a method for manufacturing thereof. Specifically, the intermetallic compound and dissolved Mg and Zn are present in the plated layer by coating Mg and Zn by physical vapor deposition on an aluminum plated steel sheet comprising a plating layer containing Al and Si, and performing diffusion heat treatment, so that the corrosion resistant and sacrificial corrosion prevention characteristics of the coated steel sheet can be improved.

Alloy-Coated Steel Sheet Manufacturing Method

A method of manufacturing an alloy-coated steel sheet according to the present invention comprises a preparation step of preparing a plated steel sheet formed a plated layer containing Al and Si, a first coating step of forming an Mg coated layer containing Mg on the plated layer, a second coating step of forming a Zn coated layer containing Zn on the Mg coated layer, and a heat treatment step of heat-treating the plated steel sheet on which the Mg coated layer and the Zn coated layer are formed to diffuse the Mg and Zn into the plated layer.

In the preparation step, a plated steel sheet formed a plated layer containing Al and Si is prepared The plated steel sheet may be a hot-dip aluminum plated steel sheet. Specifically, the aluminum plated steel sheet may comprise 88 to 90 wt % of Al, 8 to 10 wt % of Si, and 5 wt % or less of Fe based on 100 wt % of the total.

The plated layer may comprise an Al—Fe—Si alloy layer formed on the steel sheet and an Al—Si layer formed on the Al—Fe—Si alloy layer. The Al—Fe—Si alloy layer may be formed by diffusion of Fe of the plated steel sheet into the plated layer when the plated steel sheet is manufactured.

Next, in the first coating step, an Mg coated layer containing Mg is formed on the plated layer. In this case, the coating of Mg may be performed by physical vapor deposition (PVD). Specifically, it may be performed by electromagnetic levitation physical vapor deposition (EML-PVD). However, the present invention is not limited thereto, and various methods may be employed to coat Mg if it is possible to deposit Mg by a physical method such as an electron beam evaporation device, a thermal evaporation device, a sputtering source, or a cathode arc source.

Next, in the second coating step, a Zn coated layer containing Zn is formed on the Mg coated layer. In this case, the coating of Zn may be performed by physical vapor deposition (PVD). Specifically, it may be performed by electromagnetic levitation physical vapor deposition (EML-PVD). However, the present invention is not limited thereto, and various methods may be employed to coat Zn if it is possible to deposit Zn by a physical method such as an electron beam evaporation device, a thermal evaporation device, a sputtering source, or a cathode arc source.

Next, in the heat treatment step, the plated steel sheet on which the Mg coated layer and the Zn coated layer is heat-treated so that Mg and Zn are diffused into the plated layer. It may be heat-treated using an induction heating device. However, the present invention is not limited thereto, and other suitable heat treatment means may be employed.

Specifically, the plated steel sheet may be heat-treated at a temperature of 300 to 450° C., and heat-treated for 5 to 600 seconds.

The Al—Mg—Si—Zn alloy layer is formed after the heat treatment because Mg and Zn are diffused into the plated layer by the heat treatment. The Al—Mg—Si—Zn alloy layer may comprise an Mg—Zn alloy phase, and may further comprise at least one of an Al—Mg alloy phase and an Mg—Si alloy phase.

Mg—Zn alloy phase may comprise $MgZn_2$ and $Mg_2Zn_{11}$, and the Mg—Zn alloy phase may further comprise at least one of MgZn, $Mg_{21}Zn_{25}$, $Mg_{51}Zn_{20}$ and $Mg_2Zn_3$.

$MgZn_2$ and $Mg_2Zn_{11}$ in stable forms among the Mg—Zn alloy phase, as well as MgZn, $Mg_{21}Zn_{25}$, $Mg_{51}Zn_{20}$ and $Mg_2Zn_3$, which are relatively unstable phases, may be further comprised, because it is manufactured by depositing an Mg coated layer and a Zn coated layer on the plated steel sheet and then heat-treating it, rather than dipping the steel sheet in a plating bath containing Al, Mg, Si and Zn to perform hot-dip plating.

In addition, the Al—Mg alloy phase may comprise at least one of $Al_3Mg_2$ and $Al_{12}Mg_{17}$, and the Mg—Si alloy phase may comprise $Mg_2Si$.

Figure 1:
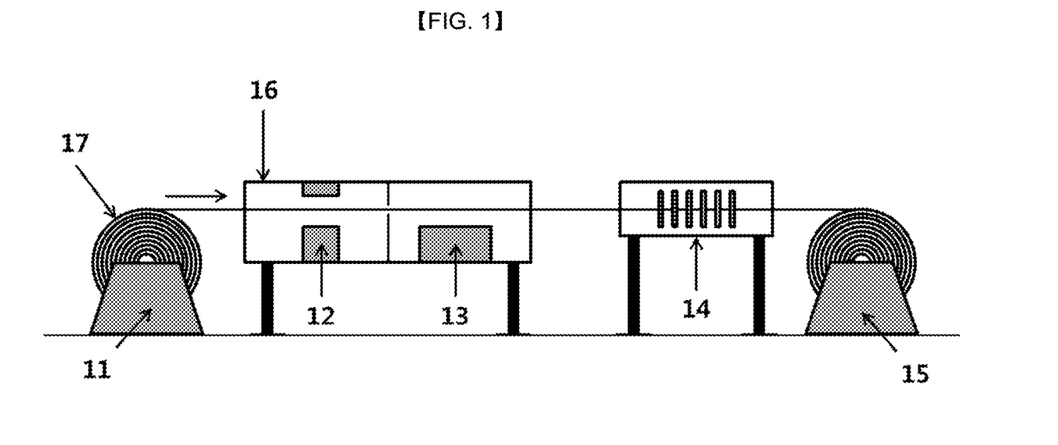
FIG. 1 is a schematic view of a continuous coating device which may be used for manufacturing an alloy-coated steel sheet.

FIG. 1 is a schematic view of a continuous coating device which may be used for manufacturing an alloy-coated steel sheet. However, this is only an example according to an exemplary embodiment of the present invention and is not limited thereto.

The apparatus disclosed in FIG. 1 is configured by a steel sheet supplying device 11 for supplying a hot-dip aluminum plated steel sheet 17 in an atmosphere, an inverse magnetron sputtering source 12 capable of pre-treating the steel sheet in vacuum, a physical vapor deposition (PVD) device 13 for coating Mg after pre-treatment, an inductive heating device 14 capable of heat-treating the steel sheet discharged to the atmosphere, and a steel sheet discharging device 15 for rewinding the heat-treated coated steel sheet again.

The PVD device 13 may be an electromagnetic levitation (EML) source. The inverse magnetron sputtering source 12 and the PVD device 13 may be installed and operated in a vacuum container 16.

First, the hot-dip aluminum plated steel sheet 17 is prepared and alkaline degreasing may be performed to remove residual oils such as anti-rust oil smeared on the surface of the steel sheet.

Thereafter, the steel sheet is supplied to the vacuum container 16 while being transferred by the steel sheet supplying device 11. Next, the surface cleaning of the steel sheet may be performed by applying power to the inverse magnetron sputtering source 12 installed in the vacuum container 16.

After the cleaning is completed, while the steel sheet is continuously transferred, Mg may be vacuum coated on the Al plated layer by the EML source 13 installed in the vacuum container 16. The Mg and Zn coatings can be formed by two-layer form and simultaneous coating.

After the coating is completed, the steel sheet is continuously transferred to be discharged to the atmosphere, and then the steel sheet may be heat-treated at a predetermined temperature for a predetermined time using the inductive heating device 14 in the atmosphere. After the heat treatment is completed, the steel sheet is continuously transferred to obtain the manufactured alloy-coated steel sheet.

Alloy-Coated Steel Sheet

Figure 2:
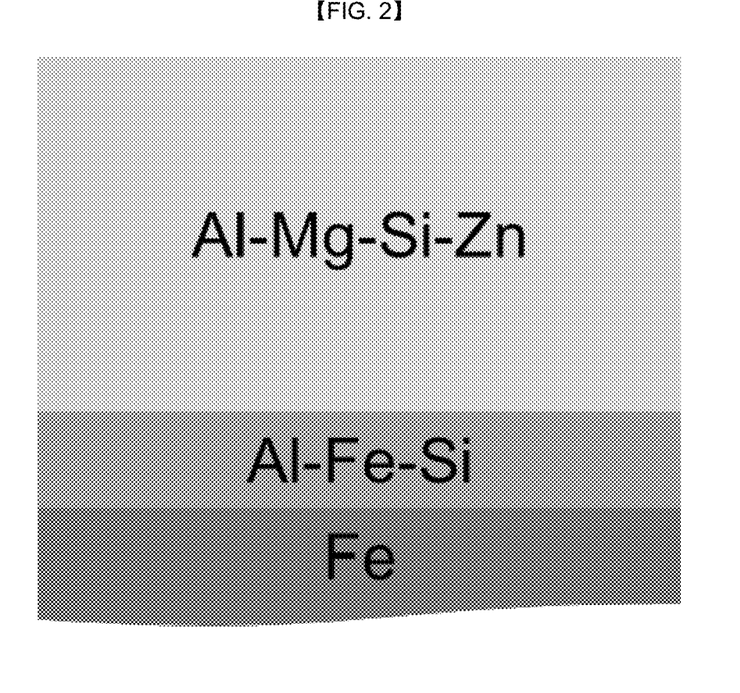
FIG. 2 is a schematic view of an alloy coated steel sheet according to an exemplary embodiment of the present invention.

When referring to FIG. 2, An alloy-coated steel sheet according to an exemplary embodiment of the present invention comprises the a steel sheet, and Al—Mg—Si—Zn alloy layer positioned on the steel sheet, wherein the Al—Mg—Si—Zn alloy layer comprises a Mg—Zn alloy phase, and wherein the Mg—Zn alloy phase comprises $MgZn_2$ and $Mg_2Zn_{11}$, and the Mg—Zn alloy phase further comprises at least one of $MgZn$, $Mg_{21}Zn_{25}$, $Mg_{51}Zn_{20}$ and $Mg_2Zn_3$.

$MgZn_2$ and $Mg_2Zn_{11}$ in stable forms among the Mg—Zn alloy phase, as well as $MgZn$, $Mg_{21}Zn_{25}$, $Mg_{51}Zn_{20}$ and $Mg_2Zn_3$, which are relatively unstable phases, may be further comprised. This may be due to a method of manufacturing an alloy-coated steel sheet by depositing an Mg coated layer and a Zn coated layer on the plated steel sheet and then performing heat treatment. According to the presence of such Mg—Zn alloy phase, the corrosion resistant and sacrificial corrosion prevention characteristics of the coated steel sheet may be improved.

In addition, the Al—Mg—Si—Zn alloy layer may further comprise at least one of an Al—Mg alloy phase and an Mg—Si alloy phase. The Al—Mg alloy phase may comprise at least one of $Al_3Mg_2$ and $Al_{12}Mg_{17}$, and the Mg—Si alloy phase may comprise $Mg_2Si$.

The Al—Mg—Si—Zn alloy layer may comprise 40 to 80 wt % Al, 15 to 30 wt % Mg, 1 to 10 wt % Si, and 1 to 20 wt % Zn, based on 100 wt % of the total. When Zn exceeds 45 wt %, the amount of Zn—Mg intermetallic compound increases due to excessive Zn, and problems such as surface blackening and reduced corrosion resistance may occur.

As the Mg coated layer and the Zn coated layer are formed on the plated steel sheet on which the plated layer containing Al and Si may be formed, and then heat treatment is performed, Fe of the plated steel sheet is partially diffused into the plated layer so that An Al—Fe—Si alloy layer may be positioned between the steel sheet and the Al—Mg—Si—Zn alloy layer.

In addition, the description of the alloy-coated steel sheet will be replaced with the description of the above-described alloy-coated steel sheet manufacturing method.

Hereinafter, specific exemplary embodiments of the present invention may be described. However, this is only an example according to an exemplary embodiment of the present invention and is not limited to exemplary embodiments below.

EXAMPLES (1) Manufacturing Alloy-Coated Steel Sheet

[Example 1] A Mg coated layer and a Zn coated layer were formed using physical vapor deposition (PVD) on a hot-dip aluminum-coated steel sheet on which a plated layer containing Al and Si was formed, and then heat treatment was performed for 300 seconds based on a heat treatment temperature of 400° C. Zn was 1.2 wt % based on the Al—Mg—Si—Zn alloy layer produced after heat treatment.

[Example 2] It was prepared under the same conditions as in Example 1, except that Zn was 2.6 wt %.

[Example 3] It was prepared under the same conditions as in Example 1, except that Zn was 5.0 wt %. [Example 4] It was prepared under the same conditions as in Example 1, except that Zn was 8.0 wt %.

[Example 5] It was prepared under the same conditions as in Example 1, except that Zn was 10.0 wt %.

[Example 6] It was prepared under the same conditions as in Example 1, except that Zn was 15.0 wt %.

[Example 7] It was prepared under the same conditions as in Example 1, except that Zn was 42.6 wt %.

[Comparative Example 1] It was prepared under the same conditions as in Example 1, except that heat treatment was performed without forming a Zn coating layer.

(2) Observation of Microstructure Change of Alloy-Coated Steel Sheet

Figure 3:
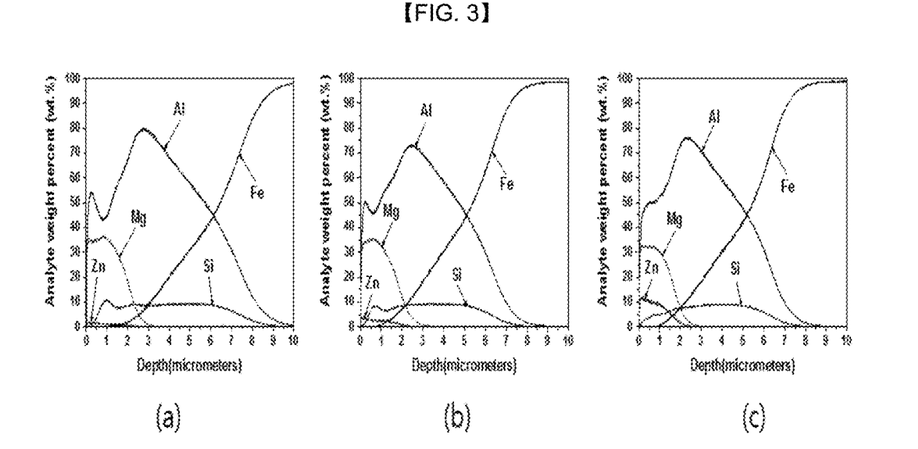
FIG. 3 is a glow discharge spectroscopic analysis result of an alloy-coated steel sheet according to an exemplary embodiment of the present invention.

FIG. 3 is a glow discharge spectroscopic analysis result of an alloy-coated steel sheet according to an exemplary embodiment of the present invention. FIG. 3(a) is a glow discharge spectroscopic analysis result of 1.2 wt % of Zn content, FIG. 3(b) is a 2.6 wt % of Zn content, and FIG. 3(c) is a 7.9 wt % of Zn content. As shown in FIG. 3, when the heat treatment time was carried out at 400° C. for 300 seconds, diffusion of Mg and Zn occurs and diffused into the aluminum plating layer. The diffusion depth of Mg and Zn was about 3 μm.

Figure 4:
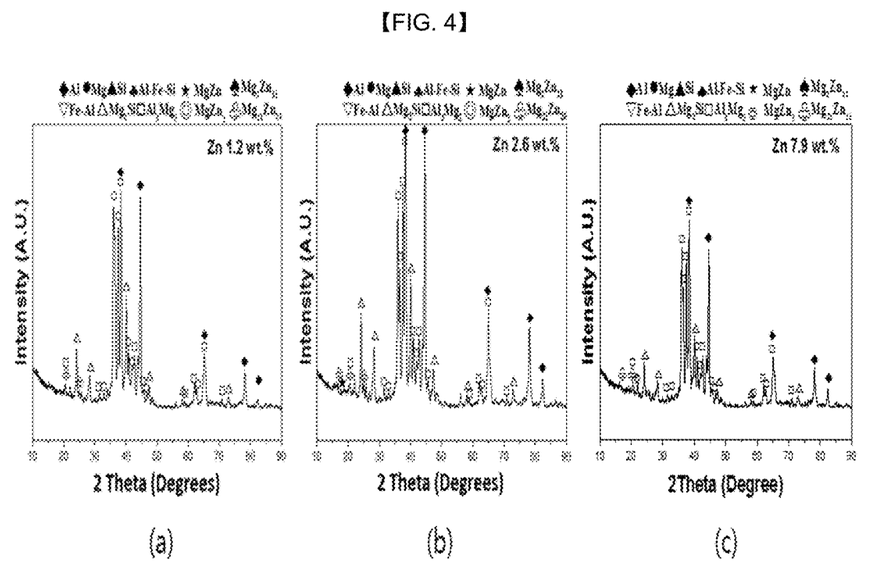
FIG. 4 is an X-ray diffraction analysis result of the alloy-coated steel sheet according to an exemplary embodiment of the present invention.

On the other hand, FIG. 4 shows the X-ray diffraction analysis results according to the Zn wt %, showing that Al—Mg, Mg—Si alloy phases were formed regardless of the Zn content. Mg—Zn alloy phase was observed in the form of $MgZn$, $MgZn_2$, $Mg_{21}Zn_{25}$, and other things below 30°. As the Zn content is lower, it may be seen from the X-ray diffraction analysis that the strength of the Mg—Zn alloy phase is smaller than that of the Al—Mg alloy phase and the Mg—Si alloy phase.

(3) Evaluation of Corrosion Resistance of Alloy-Coated Steel Sheet

Figure 5:
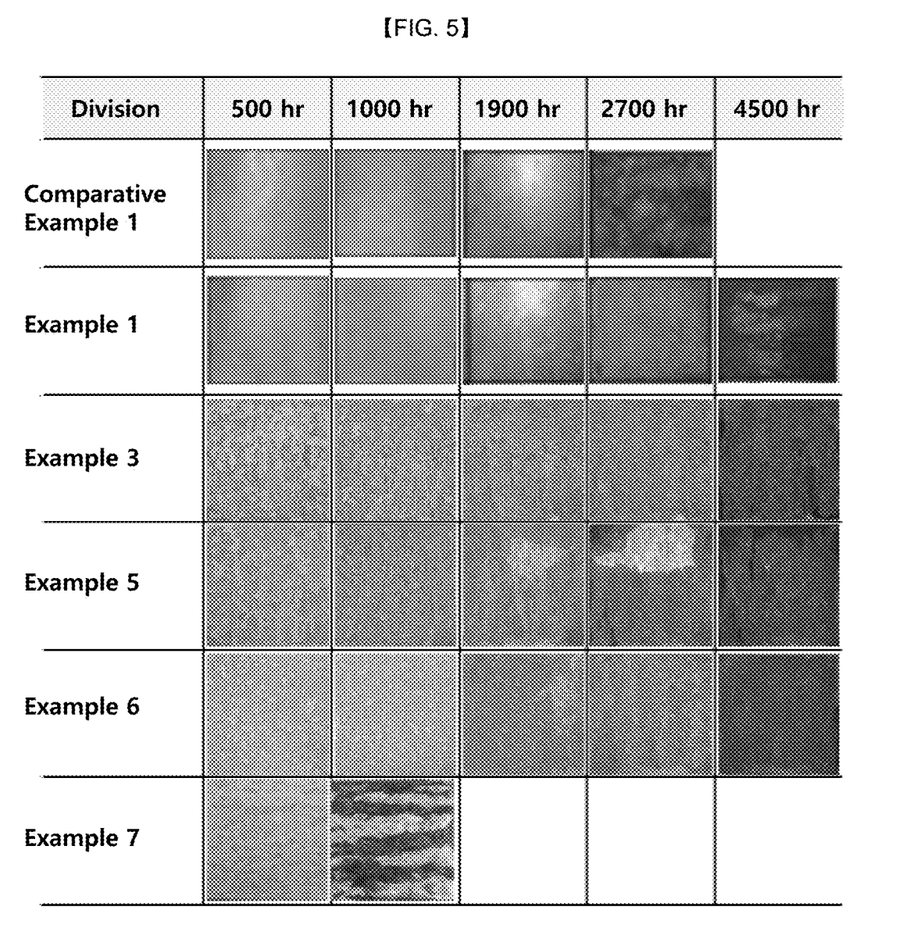
FIG. 5 is a salt spray test result of the alloy-coated steel sheet of Example 1 and Comparative Example 1 of the present invention.

FIG. 5 is a salt spray test result of an Al—Mg—Si alloy-coated steel sheet containing no Zn (Example 1) and an Al—Mg—Si—Zn alloy-coated steel sheet containing 1.2 wt % of Zn (Comparative Example 1). The salt spray test was conducted according to ASTM B-117.

As shown in FIG. 5 and Table 1, in the coated steel sheet containing no Zn, it may be seen that the red rust is spread throughout the specimen after 2700 hours. In the coated steel sheet containing 1.2 wt % of Zn, it may be seen that the red rust did not spread to the entire area of the specimen even after 2700 hours. It may be seen that Examples 3, 5, and 6 have a smaller red rust area than Example 1 even after 4500 hours. Example 7 showed the lowest corrosion resistance among Examples with a Zn content of 42.6 wt %. As described above, as the Zn content increases, the amount of intermetallic compounds increase, which is considered to be due to the phenomenon of blackening and deterioration of corrosion resistance.

TABLE 1

| Division | Plated material | Plated amount (g/m²) | Coating material | Zn content (wt %) | Heat treatment temperature (° C.) | Heat treatment time (senconds) |
| --- | --- | --- | --- | --- | --- | --- |
| Example 1 | Al—Si | 15 | Mg/Zn | 1.2 | 400 | 300 |
| Example 2 | Al—Si | 15 | Mg/Zn | 2.6 | 400 | 300 |
| Example 3 | Al—Si | 15 | Mg/Zn | 5.0 | 400 | 300 |
| Example 4 | Al—Si | 15 | Mg/Zn | 8.0 | 400 | 300 |
| Example 5 | Al—Si | 15 | Mg/Zn | 10.0 | 400 | 300 |
| Example 6 | Al—Si | 15 | Mg/Zn | 15.0 | 400 | 300 |
| Example 7 | Al—Si | 15 | Mg/Zn | 42.6 | 400 | 300 |
| Comparative Example 1 | Al—Si | 15 | Mg/Zn | 0 | 400 | 300 |

The present invention is not limited to the implementation exemplary embodiments and/or examples, but may be manufactured in various forms and those skilled in the art will understand that the present invention may be implemented in another specific form without changing the technical spirit or an essential feature thereof. Therefore, it should be appreciated that the aforementioned implementation exemplary embodiments and/or examples are illustrative in all aspects and are not restricted.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. An alloy-coated steel sheet comprising:
    a steel sheet; and
    Al—Mg—Si—Zn alloy layer positioned on the steel sheet,
    wherein the Al—Mg—Si—Zn alloy layer comprises a Mg—Zn alloy phase,
    the Mg—Zn alloy phase comprises $MgZn_2$ and $Mg_2Zn_{11}$,
    the Mg—Zn alloy phase further comprises at least one of $Mg_1Zn_1$, $Mg_{21}Zn_{25}$, $Mg_{51}Zn_{20}$ and $Mg_2Zn_3$, and
    the Al—Mg—Si—Zn alloy layer comprises 1 to 20 wt % of Zn based on 100 wt % of total.

2. The steel sheet of claim 1, wherein the Al—Mg—Si—Zn alloy layer comprises 5 to 30 wt % of Mg based on 100 wt % of total.

3. The steel sheet of claim 1, wherein the Al—Mg—Si—Zn alloy layer further comprises Al—Mg alloy phase.

4. The steel sheet of claim 3, wherein the Al—Mg alloy phase comprises at least one of $Al_3Mg_2$ and $Al_{12}Mg_{17}$.

5. The steel sheet of claim 1, further comprising Al—Fe—Si alloy layer positioned between the steel sheet and the Al—Mg—Si—Zn alloy layer.

6. The steel sheet of claim 1, wherein the Al—Mg—Si—Zn alloy layer further comprises Mg—Si alloy phase.

7. The steel sheet of claim 6, wherein the Mg—Si alloy phase comprises $Mg_2Si$.

8. The steel sheet of claim 1, wherein the Al—Mg—Si—Zn alloy layer further comprises Al—Mg alloy phase and Mg—Si alloy phase.

9. The steel sheet of claim 1, wherein the Al—Mg—Si—Zn alloy layer comprises $Mg_2Si$ and $Al_3Mg_2$.

10. The steel sheet of claim 6, wherein the Al—Mg—Si—Zn alloy layer comprises $Mg_2Si$ and $Al_{12}Mg_{17}$.

11. The steel sheet of claim 6, wherein the Al—Mg—Si—Zn alloy layer comprises $Mg_2Si$, $Al_3Mg_2$ and $Al_{12}Mg_{17}$.

* * * * *